United States Patent
Shoop et al.

[19]

[11] Patent Number: 6,037,682
[45] Date of Patent: Mar. 14, 2000

[54] INTEGRATED MULTI-MODE TRANSDUCER AND METHOD

[75] Inventors: Kevin M. Shoop; Frederick T. Calkins, both of Des Moines; Gerard N. Weisensel, Ames, all of Iowa

[73] Assignee: Etrema Products, Inc., Ames, Iowa

[21] Appl. No.: 09/004,581

[22] Filed: Jan. 8, 1998

[51] Int. Cl.[7] .................................................. H02N 2/00
[52] U.S. Cl. ............................................................ 310/26
[58] Field of Search ............................. 310/26, 328, 316, 310/326

[56] References Cited

U.S. PATENT DOCUMENTS

| 2,876,419 | 3/1959 | Gianola et al. | 310/26 |
| 4,078,160 | 3/1978 | Bost | 310/331 |
| 5,249,117 | 9/1993 | Greenough et al. | 310/26 |
| 5,510,660 | 4/1996 | Flatau et al. | 310/26 |
| 5,869,918 | 2/1999 | Ashizawa | 310/328 |

FOREIGN PATENT DOCUMENTS

| 0 391 880 | 10/1990 | European Pat. Off. | 310/26 |
| 1 188 677 | 3/1965 | Germany | 310/26 |
| 27 09 074 | 9/1977 | Germany | 310/26 |
| 2-237477 | 9/1990 | Japan | 310/26 |

OTHER PUBLICATIONS

ETREMA Products, Inc., "ETREMA Terfenol–D Magnetostrictive Actuators," (1993 or earlier), 6 pages.

Goodfriend, et al., "High force, high strain, wide band width linear actuator using the magnetostrictive material, Terfenol–D," (1993 or earlier), 12 pages.

ETREMA Products, Inc., "ETREMA TERFENOL–D Magnetostrictive Actuators," (Dec. 31, 1995 or earlier) 4 pages.

Butler, J.L., "Application Manual for the Design of ETREMA TERFENOL–D Magnetostrictive Tranducers," (1998) pp. 1–67.

Miller, "High Force, High Strain, Wide Bandwidth Linear Actuators Using the Magnetostrictive Material Terfenol–D," (1991) Proceedings on the Conference on Recent Advances in Active Control of Sound and Vibration, Technomic Publishing Co., Inc., Lancaster, PA, 9 pages.

EDGE Technologies, Inc., ETREMA Products Division, "Magnetostrictive Actuators," (Date unknown) 3 pages.

EDGE Technologies, Inc., "Magnetostrictive Actuators," (Published in 1992, estimate) 4 pages.

NASA Tech Briefs, "Magnetostrictive Transducers Would Sense and Damp Vibrations," (Oct. 1996) pp. 42–43.

NASA Tech Briefs, "Magnetostrictive Transducers Would Sense and Damp Vibrations," (1996 or earlier) pp. 1–11.

American Defense Preparedness Association, "Active Materials & Adaptive Structures," (Nov. 1991) pp. 79.

M. Mattice, et al., "Innovative active control of gun barrels using smart materials," (1997) pp. 630–641.

R.C. Fenn, et al., "Passive damping and velocity sensing using magnetostrictive transduction," (Feb. 1994) SPIE vol. 2190, pp. 216–227.

(List continued on next page.)

*Primary Examiner*—Thomas M. Dougherty
*Attorney, Agent, or Firm*—Flehr Hohbach Test Albritton & Herbert LLP

[57] ABSTRACT

An integrated multi-mode transducer for use with a member to control movement of the member. The transducer includes an active element adaptable to engage the member. The active element is changeable from a first shape to a second shape in the presence of an electromagnetic field. Apparatus including a controller is provided for producing an electromagnetic field which extends through at least a portion of the active element to change the shape of the active element and thus exert a force on the member, for sensing movement of the member and for damping movement of the member. A method for using the transducer is provided.

12 Claims, 3 Drawing Sheets

OTHER PUBLICATIONS

N.W. Hagood, et al., Dampingof Structural Vibrations With Piezoelectric Materials and Passive Electrical Networks (1991) Journal of Sound and Vibration, pp. 243–268.

N.W. Hagood, et al., "Simultaneous Sensing and Actuation Using Piezoelectric Materials," (1991) SPIE vol. 1543, pp. 409–421.

C.G. Namboodri, et al., "Tunable Vibration/Strain Sensing With Electrotrictive Materials," (Apr. 1992) NASA, pp. 285–297.

J.J. Dosch, et al., "A Self–Sensing Piezoelectric Actuator for Collocated Control," (1992) Technomic Publishing Co., Inc., pp. 166–185.

K.B. Hathaway, et al., "Magnetomechanical Damping in Giant Magnetostriction Alloys," (1995) Metallurigical and Materials Transactions A, vol. 26A, pp. 2797–2801.

J.R. Pratt, "Design and analysis of a self–sensing Terfenol–D magnetostrictive actuator," (1993) Iowa State University, Ames, Iowa, pp. 1–92.

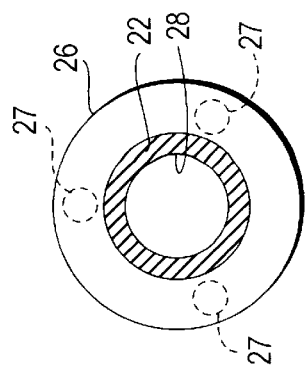
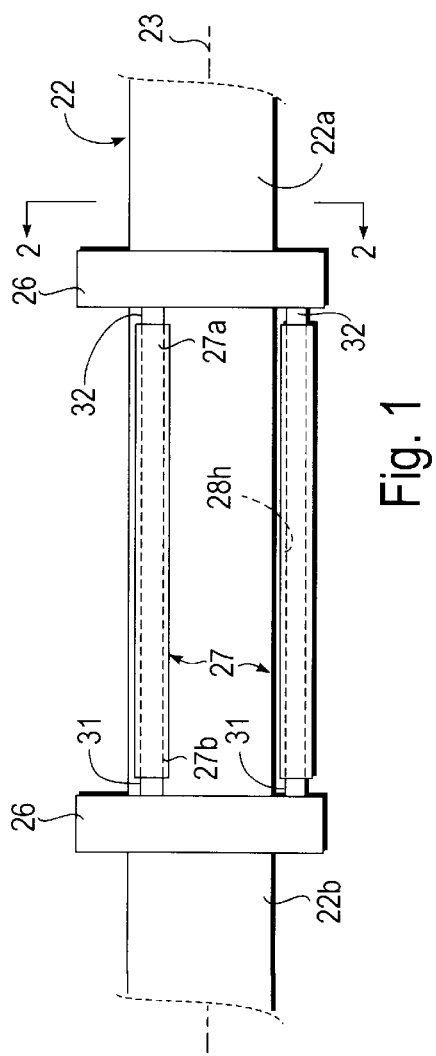
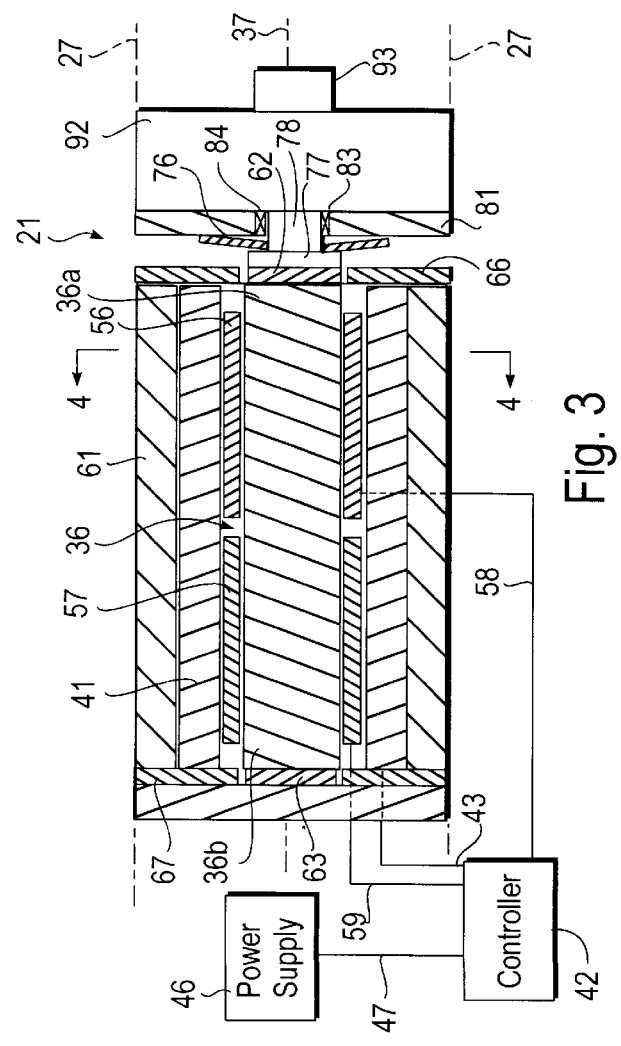

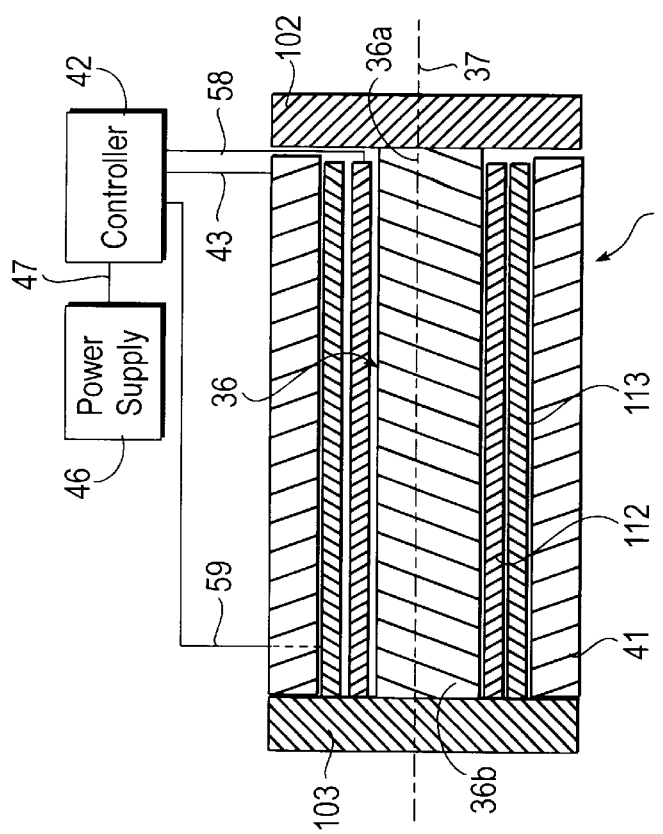
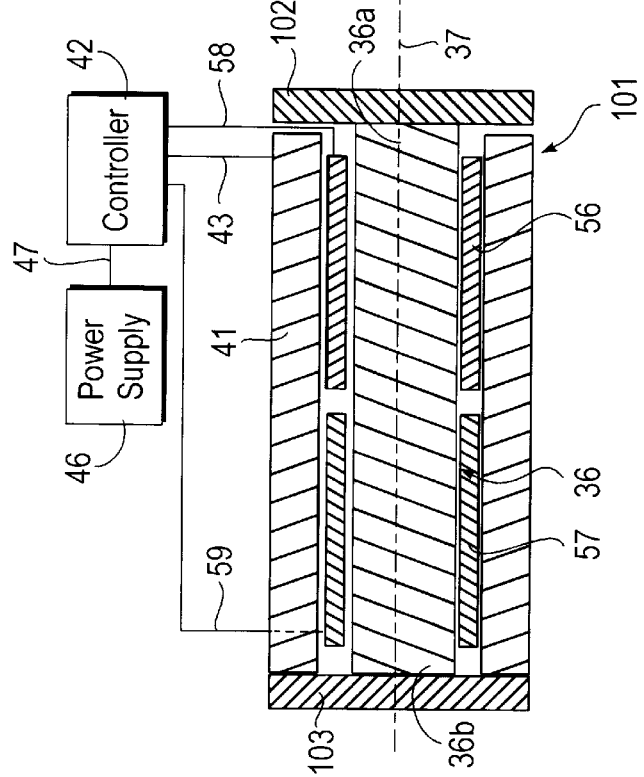
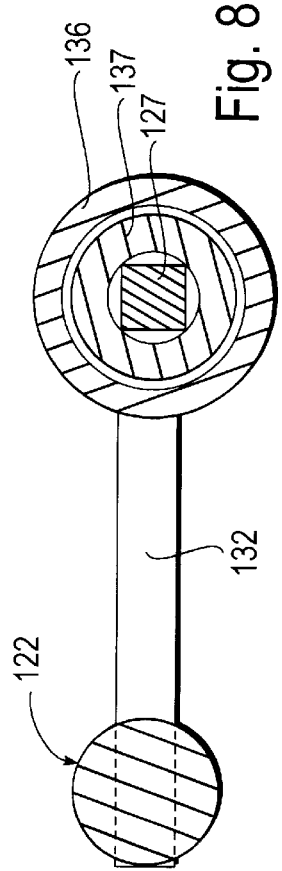

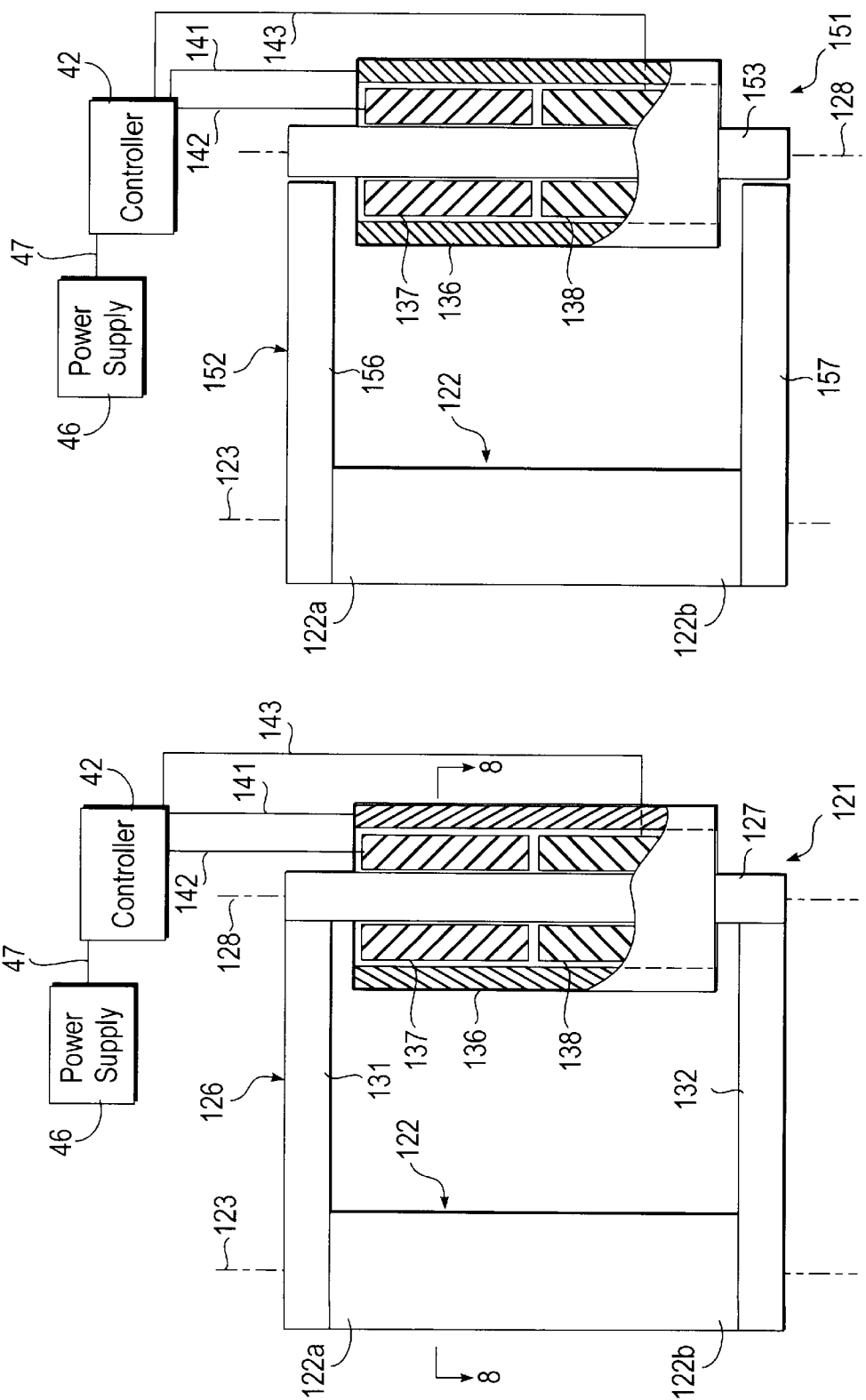

INTEGRATED MULTI-MODE TRANSDUCER AND METHOD

This invention pertains generally to transducers and, more particularly, to transducers utilizing active elements.

There are many applications where the addition of passive vibration damping to a structural system can greatly increase the system performance or stability. Traditionally, passive vibration control techniques, such as viscoelastic materials or vibration absorbers, have been used to improve the dynamics and control of critical systems. However, viscoelastic materials have the limitations of strong temperature dependence and lose effectiveness in the lower frequency range, while tuned absorbers are, by design, effective only over a narrow bandwidth of operation.

Structures have been made adaptable or "smart" by employing active damping, vibration control, health monitoring and micropositioning. Conventional actuation technology such as electrodynamic voice coil actuators can be used, but such technology is typically limited in frequency and force. More recent transducer technologies include smart materials such as magnetostrictors, electrostrictors, piezoelectrics, shape memory alloys, magnetorheological and electrorheological fluids and, in some cases, fiber optics. However, present technologies and configurations, even using smart materials, still have not achieved all of the required performance and cost goals. Shape memory alloys do not have the bandwidth required due to their dependence on relatively slow thermal dynamics. Magnetorheological and electrorheological fluids do not directly provide for the needed actuation. Piezoceramic actuators have reasonable bandwidth and force, but have limitations of reliability and thermal stability.

Very recent improvements have been made in the utilization of smart material actuators by combining functional modes of operation, such as actuation and sensing or actuation and damping. These transducers, however, suffer from certain inefficiencies and limitations in flexibility. There is, therefore, a need for a new and improved transducer which overcomes these disadvantages.

In general, it is an object of the present invention to provide a transducer and method which permits flexibility in the combination of actuation, sensing and damping of structures.

Another object of the invention is to provide a transducer and method of the above character which utilizes a drive element made from a magnetostrictive material.

Another object of the invention is to provide a transducer and method of the above character which utilizes the hysteretic damping of the magnetostrictive drive element.

Another object of the invention is to provide a transducer and method of the above character which utilizes at least one bias magnet to provide the mechanical preload to the magnetostrictive drive element.

Additional objects and features of the invention will appear from the following description from which the preferred embodiments are set forth in detail in conjunction with the accompanying drawings.

FIG. 1 is a fragmentary side elevational view of a plurality of three of the integrated multi-mode transducers of the present invention mounted for use on an elongate cylindrical member.

FIG. 2 is a cross-sectional view of the elongate member of FIG. 1 taken along the line 2—2 of FIG. 1.

FIG. 3 is a cross-sectional view, somewhat schematic, of one of the integrated multi-mode transducers of FIG. 1.

FIG. 4 is a cross-sectional view of the integrated multi-mode transducer of FIG. 3 taken along the line 4—4 of FIG. 3.

FIG. 5 is a cross-sectional view, somewhat schematic, of another embodiment of the integrated multi-mode transducer of the present invention.

FIG. 6 is a cross-sectional view, similar to FIG. 5, of a further embodiment of the integrated multi-mode transducer of the present invention.

FIG. 7 is a somewhat schematic view, partially cut away, of yet a further embodiment of the integrated multi-mode transducer of the present invention.

FIG. 8 is a cross-sectional view of the integrated multi-mode transducer of FIG. 7 taken along the line 8—8 of FIG. 7.

FIG. 9 is a somewhat schematic view, partially cut away and similar to FIG. 8, of another embodiment of the integrated multi-mode transducer of the present invention.

In general, an integrated multi-mode transducer for use with a member to control movement of the member is provided. The transducer includes an active element adaptable to engage the member. The active element is changeable from a first shape to a second shape in the presence of an electromagnetic field. Means including a controller is provided for producing an electromagnetic field which extends through at least a portion of the active element to change the shape of the active element and thus exert a force on the member, for sensing movement of the member and for damping movement of the member. A method for using the transducer is provided.

More in particular, integrated multi-mode apparatus or transducer 21 of the present invention is for use with an elongate member 22 extending along a central longitudinal axis 23 and having first and second spaced-apart portions 22a and 22b. Elongate member 22 can be a shaft, a gun barrel, a strut or part of any other suitable structure such as a space station truss. As shown in FIG. 1, elongate cylindrical member 22 is made from any suitable material such as steel and is generally tubular in conformation. Alternatively, it should be appreciated that elongate member 22 can be of a solid cylindrical construction which is circular or non-circular in cross-section. An annular collar 26 made from steel or any other suitable material is secured around the outside of each portion 22a and 22b. A plurality of three elongate transducer housings 27 extend longitudinally between collars 26. Housings 27 are circumferentially spaced-apart around the elongate member 22 in symmetrical disposition at spacing angles of approximately 120° about longitudinal axis 23 (see FIG. 2). Each of transducer housings 27 is made from any suitable material such as steel and has first and second end portions 27a and 27b and a bore 28 extending between the end portions. A bracket 31 rigidly mounts the first end portion 27a of each housing 27 to one of collars 26. A telescoping arm 32 is slidably disposed within bore 28 in the second end portion 27b of each housing 27. The outer end of each arm 32 is welded or otherwise suitably secured to the other collar 26.

Transducer 21 is illustrated in FIGS. 3 and 4 and has an active element or drive rod 36 made from a suitable active or smart material which changes shape when energized by being placed in an electromagnetic field. Elongate drive rod 36 has first and second end portions 36a and 36b and extends along a central longitudinal axis 37. The drive rod 36 is cylindrical in shape and, more specifically, has a circular cross-section. The materials of drive rod 36 can include electrostrictive materials, piezoelectric materials and magnetostrictive materials. A preferred electrostrictive material is lead magnesium niobate and its variants and a preferred piezoelectric material is lead zirconate titanate and its variants. A magnetostrictive material, which changes shape in response to an applied magnetic field, is a particularly preferred material. Specifically, piston-like element or drive rod 36 is changeable between a first or shortened shape when in the absence of a magnetic field and a second or elongated shape when in the presence of a magnetic field. A giant magnetostrictive material is preferred because such a material can tolerate high mechanical stress for magnetic moment alignment so as to permit the drive rod 36 to have a relatively high transduction capability. High transduction capability, along with high energy density, enable more mechanical power output from a given electrical power input and volume of smart material which thus reduces the size and weight of transducer 21. Such materials also have inherent high reliability. Preferred giant magnetostrictive materials are rare earth materials, rare earth-transition metal materials and compositions having rare earth materials, transition metals and other elements.

Preferred rare earth materials for operating temperatures ranging from 0° to 200° K are rare earth binary alloys such as $Tb_xDy_{1-x}$, where x ranges from 0 to 1. Other rare earth elements can be added or substituted for either terbium or dysprosium in this base alloy. For example, holmium, erbium or gadolinium can be used in place of either terbium or dysprosium. Other preferred rare earth materials for operating temperatures ranging from 0° to 200° K are body centered cubic intermetallic compounds such as $(Tb_xDy_{1-x})(Zn_yCd_{1-y})$, where x ranges from 0 to 1, y ranges from 0 to 1 and x+y=1. Other rare earth elements, such as holmium, erbium or gadolinium, can be added or substituted for either terbium or dysprosium in these body centered cubic intermetallic compounds.

Preferred rare earth-transition metal materials are rare earth-iron materials such as TERFENOL based alloys. These alloys are suited for operating temperatures ranging from 0° to 700° K. One of these alloys is $TbFe_2$. Particularly preferred rare earth-iron materials for operating in the 0° to 700° K. temperature range are disclosed in U.S. Pat. Nos. 4,308,474; 4,609,402; 4,770,704; 4,849,034 and 4,818,304, incorporated herein by this reference, and include the material known as TERFENOL-D sold by ETREMA Products, Inc. of Ames, Iowa. TERFENOL-D is a metal alloy formed from the elements terbium, dysprosium and iron and has the formula of $Tb_xDy_{1-x}Fe_{2-w}$, where x ranges from 0 to 1 and w ranges from 0 to 1. A preferred formula for TERFENOL-D is $Tb_xDy_{1-x}Fe_{1.90-1.95}$, where x ranges from 0.25 to 1.0. A particularly preferred formula for the TERFENOL-D material of drive rod 36 is $Tb_{0.3}Dy_{0.7}Fe_{1.92}$. Other rare earth materials, such as cerium, praseodymium, neodymium, holmium, erbium or gadolinium, can be added or substituted for terbium or dysprosium for property enhancement purposes. For example, a giant magnetostrictive material having the rare earth materials $R^1_{x1}, R^2_{x2}, R^3_{x3} \ldots R^n_{xn}$ can be provided where $R^1, R^2, R^3 \ldots R^n$ constitute rare earth materials and x1+x2+x3...+xn=1. Other transition metals, such as manganese, cobalt or nickel, can be added or substituted for iron as disclosed in U.S. Pat. No. 5,110,376, incorporated herein by this reference. Elements which are not transition metals, such as aluminum, can also be added or substituted for iron. For example, a giant magnetostrictive material having the elements $T^1_{y1}, T^2_{y2}, T^3_{y3} \ldots T^n_{yn}$ can be provided where $T^1, T^2, T^3 \ldots T^n$ constitute transition metals or elements such as aluminum and y1+y2+y3...+yn=2−w, and w ranges from 0 to 1. Alternatively, an intermetallic compound can be provided having combinations or variations of TERFENOL-D, such as $(Tb_{x1},Dy_{x2},R^3_{x3},R^4_{x4} \ldots R^n_{xn})(Fe_{y1},T^2_{y2},T^3_{y3} \ldots T^n_{yn})_{2-w}$ where x1+x2+x3...+xn=1, y1+y2+y3...+yn=2−w, and w ranges from 0 to 1.

Giant magnetostrictive materials which contract and thus exhibit negative magnetostriction when placed in a magnetic field can be used for the material of drive rod 36 and be within the scope of the present invention. These negative magnetostrictive materials have formulations similar to the giant magnetostrictive materials described above except that they include the rare earth element samarium. Preferred negative magnetostrictive materials for operating temperatures ranging from 0° to 700° K are SAMFENOL based alloys such as $SmFe_2$. A particularly preferred SAMFENOL based alloy is SAMFENOL-D, which is also disclosed in U.S. Pat. Nos. 4,308,474; 4,609,402; 4,770,704; 4,849,034 and 4,818,304 and has the formula $Sm_xDy_{1-x}Fe_{2-w}$ where x ranges from 0 to 1 and w ranges from 0 to 1. Other rare earth materials, such as cerium, praseodymium, neodymium, holmium, erbium or gadolinium, can be added or substituted for samarium or dysprosium in the same manner as discussed above with respect to TERFENOL based alloys. In addition, other transition metals, such as manganese, cobalt or nickel, and elements which are not transition metals, such as aluminum, can be added or substituted for iron in the same manner as also discussed above.

Means is provided in transducer 21 for producing an electromagnetic field which extends through at least a portion of drive rod 36 to change the shape of the drive rod 36, for sensing movement of the drive rod 36 and for damping movement of the drive rod 36. In this regard, a first elongate tubular means or coil 41 is concentrically disposed about drive rod 36 and is included within the means of transducer 21 for producing a magnetic field through drive rod 36. First or excitation coil 41 has a length approximating the length of drive rod 36 and is made from any suitable conductive material such as fine magnetic wire of copper, aluminum or niobium titanium for producing a magnetic field having a flux which extends through the drive rod 36. Means for providing an electrical signal to excitation coil or wire solenoid 41 includes a controller 42 electrically coupled to the coil 41 by means of lead means or wire 43 and a power supply 46 electrically coupled to the controller 42 by means of lead means or wire 47. A single controller 42 is electrically coupled to the excitation coils 41 of the three transducers 21 mounted on elongate member 22. Controller 42 can be designed and constructed by one skilled in the art having knowledge of the type disclosed in the book Modern Control Engineering, Second Edition 1990, written by Katsuhiko Ogata and published by Prentice Hall.

Means which includes second and third elongate tubular means or coils 56 and 57 is included within transducer 21 for sensing and damping motion of drive rod 36. Sensing and damping coils 56 and 57 are made from any suitable conductive material such copper or aluminum. The sensing and damping coils 56 and 57 are concentrically disposed about drive rod 36 inside excitation coil 51 in axial alignment relative to central longitudinal axis 37. As such, sensing and damping coils 56 and 57 each have an inner diameter slightly larger than the outer diameter of drive rod 36 and an outer diameter slightly smaller than the inner diameter of excitation coil 41. The sensing and damping coils 56 and 57 have an aggregate length approximately equal to the length of first coil 41. As shown in FIG. 3, each of sensing and damping coils 56 and 57 is disposed around approximately one-half the length of first coil 41. Lead means in the form of wires 58 and 59 serve to respectively couple sensing and damping coils 56 and 57 of each of the three transducers 21 to controller 42, which has signal conditioning therein for the sensing mode of transducer 41 and dissipation networks for the damping mode of the transducer 41.

Tubular magnetic means including tubular bias magnet 61 is provided in transducer 21 for magnetically biasing drive rod 36. Bias or permanent magnet 61 is made from any suitable permanent magnet material such as neodymium iron boron, samarium cobalt, aluminum nickel cobalt or iron and is concentrically disposed around excitation coil 41. The bias magnet 61 has an inner diameter slightly larger then the outer diameter of excitation coil 41 and a length approximately equal to the length of the excitation coil.

First and second flux return means are carried by transducer housing 27 for capturing the dc magnetic field created by bias magnet 61 and directing this dc field through drive rod 36 (see FIG. 3). The first and second flux return means also capture the ac magnetic field generated by excitation coil 41 and channel this ac field into drive rod 36. The first and second flux return means include first and second inner annular disk-like members or magnetic disks 62 and 63 and first and second annular ring members or magnetic rings 66 and 67. First and second disks 62 and 63 are disposed on the opposite end surfaces of drive rod 36 and have an outer diameter approximately equal to the outer diameter of the drive rod. First and second rings 66 and 67 are concentrically disposed about respective first and second disks 62 and 63 at the opposite ends of coils 41, 56 and 57 and bias magnet 61. The rings 66 and 67 each have an inner diameter approximately equal to the inner diameter of coils 56 and 57 and an outer diameter approximately equal to the outer diameter of bias magnet. In an alternate embodiment (not shown), a single disk-shaped flux return element having an outer diameter approximating the outer diameter of bias magnet 61 can be disposed on each end of drive rod 36.

Disks 62 and 63 and rings 66 and 67 are each made from any suitable ferromagnetic or soft magnetic material having a relatively low electrical conductivity and a relatively high electrical resistivity. The flux return elements 62, 63, 66 and 67 also have a relatively high magnetic saturation flux density. It is preferred that the material of elements 62, 63, 66 and 67 has an electrical resistivity greater than 1000 ohm-cm, although a more practical electrical resistivity range is between 0.01 to 1000 ohm-cm. It is preferable that the magnetic saturation flux density be greater than 8,000 gauss, more preferably greater than 12,000 gauss and most preferably greater than 20,000 gauss.

A suitable material for elements 62, 63, 66 and 67 is the material marketed under the trade name High Flux by Arnold Engineering of Marengo, Ill. and Magnetics of Butler, Pa. High Flux is a nickel and iron alloy having the composition of 0.5 nickel and the balance iron. The nickel and iron elements of the High Flux material are ground into micron and sub-micron particle sizes. A dielectric is sprayed on the particles to electrically insulate them and that powder mix is compressed at roughly 200 tons per square inch to make a solid component which is the equivalent of a sandstone structure. Another suitable material is iron powder marketed by MMG-North America of Paterson, N.J. The iron powder has a composition of greater than 95% iron. The iron powder is produced in a manner similar to the method for producing High Flux described above. Briefly, the iron elements are ground into micron and sub-micron particle sizes. A dielectric is sprayed on the particles to electrically insulate them and that powder mix is compressed to make a solid component which is the equivalent of a sandstone structure. Each of these materials has an electrical resistivity ranging from 0.01 to 50 ohm-cm and a magnetic saturation flux density ranging from 12,000 to 15,000 gauss. High flux has a high relative permeability which makes it a better magnetic flux conductor.

Means is included within transducer 21 for imparting a preload on drive rod 36 and includes a belleville spring 76 of any conventional type and a preload disk 77 in juxtaposition with first disk 62. A cylindrical push rod 78 is formed integral with preload disk 77 and extends along longitudinal axis away from drive rod 36. Preload disk 77 and push rod 78 are each made from any suitable material such as steel. First and second disk-like end caps 81 and 82 made from steel or any other suitable material are disposed perpendicularly to longitudinal axis 37. First end cap 81 is longitudinally spaced apart from first disk and ring 62 and 66. Second end cap 82 is in juxtaposition with second disk and ring 63 and 67. A central bore 83 extends through first end cap 81 and a conventional bearing 84 is press fit or otherwise suitable seated in bore 83 for permitting longitudinal movement of push rod 78 with respect to the end cap 81. Spring 76 is mounted about push rod 78 and seats against first end cap 81 to urge preload disk 77 toward second end cap 82 and thus exert a compressive load on drive rod 36.

Transducer 21 has a stroke amplifier 92 for increasing its stroke beyond the amount by which drive rod 36 changes in length under the influence of excitation coil 41. Push rod 78 is coupled to stroke amplifier 92 in a conventional manner. Stroke amplifier 92, not cross sectioned in the drawings, can be of any conventional type such as a hydraulic stroke amplifier and preferably a Bernoulli-type stroke amplifier. The amplifier 92 has an output rod 93 slidably carried therein and movable longitudinally as a function of the longitudinal movement of drive rod 36. Alternate embodiments of transducer 21 can be provided without a stroke amplifier.

Transducer 21 is rigidly secured inside bore 28 of transducer housing 27 by any suitable means such as bolts (not shown). In this regard, end caps 81 and 82 are secured to the inside of housing 27 in a conventional manner. Output rod 93 of stroke amplifier 92 is connected in a conventional manner to slidable arm 32 such that longitudinal movement of output rod 93 on longitudinal axis 37 results in a one-to-one movement of arm 32 on the longitudinal axis.

In their method of operation, the three transducers 21 can be used to actively and/or passively control the movement of elongate member 22. As more fully described in U.S. patent application Ser. No. 08/855,228 filed May 13, 1997 (A-64718), belleville spring 76 serves to create a longitudinal preload on drive rod 36 which remains constant throughout the actuation and deactuation of the drive rod 36. The preload externally causes the magnetic moments to be more perfectly oriented perpendicular to the longitudinal axis 37 of drive rod 36. When energized by power supply 46, controller 42 provides a suitable electrical signal to each excitation coil 41 so as to generate a magnetic field about the excitation coil having a strength and direction corresponding to the amplitude and frequency of the electrical signal from the controller 42. Coil 41 is sized and shaped and positioned relative to the drive rod 36 so that the magnetic field generated thereby preferably extends through the entire drive rod 36. The magnetic field causes the magnetostrictive drive rod 36 to change shape or strain. Specifically, the magnetic moments in the magnetostrictive material align with longitudinal axis 37 when a magnetic field parallel to axis 37 is applied to drive rod 36. Each of the bias magnets 61 is sized and shaped and positioned relative to the drive rod 36 to provide a uniform dc magnetic field which extends through the entire drive rod 36 and, together with the changing magnetic field produced by excitation coil 41, causes the drive rod 36 to expand from a first home position to a second elongated position and relax back to its first home position at the frequency of the electrical signal provided by controller 42 to coil 41. The substantially uniform magnetic bias through drive rod 36 is further facilitated by the use of flux return elements 62, 63, 66 and 67. The flux return elements 62, 63, 66 and 67 also serve to capture the ac magnetic field created by drive coil 41 and channel that field through drive rod 36 so as to increase the ac magnetic field intensity in the drive rod and thus enhance the performance of transducer 21.

Transducers 21 actively input energy into elongate member 22 for reducing vibrations in the system. In this regard, the elongation of drive rod 36 discussed above causes the related transducer 21 to exert a force along longitudinal axis 37 which, by means of adapting output rod 93 and arm 32, urges collars 26 away from each other. The three transducers 21 shown in FIGS. 1 and 2 are used, individually or in combination, to bend or move elongate member 22 in any direction about central longitudinal axis 23 and thus reduce actively vibrations in the elongate member 22.

Sensing coils 56 permit the three transducers 21 to measure and monitor the externally caused vibrations and bendings in elongate member 22. This externally inputted mechanical energy in the elongate member results in a compressive force being exerted longitudinally on all or some of the drive rods 36 of the transducers 21, which force is in turn converted to magnetic energy by the drive rods. The magnetic fields resulting from this magnetic energy are picked up and thus measured by the sensing coils 56 disposed about the drive rods 36 and result in the generation of an electrical signal in the sensing coils 56 which is transmitted by wires 58 to controller 42. In this manner, the transducers 21 and the controller 42 can be used to sense the vibrational or other forces and corresponding movements being experienced by elongate member 22.

Damping coils 57 permit passive dissipation of energy from the system. The damping coils 57 operate substantially in the same manner as sensing coils 56 to pick up magnetic energy generated by the compressive force exerted on the drive rods 36. Damping coils 57 convert this magnetic energy to an electrical signal which is carried by wires 59 to controller 42. A resistor (not shown) or other suitable shunting means is included within the dissipation network of controller 42 to dissipate electrical energy generated by damping coils 57 and thus dissipate the corresponding vibrational or other mechanical energy experienced by elongate member 22.

Drive rod 36 also acts passively as a hysteretic damper. As such a passive damper, the inherent hysteresis of magnetostrictive drive rod 36 is utilized to dissipate unwanted forces and energy experienced by elongate member 22. Drive rod 36 can also be utilized as an active damper. For example, controller 42 can be used to actively adjust, in response to a sensed signal or otherwise, the magnetic bias of rod 36 by applying a DC current through excitation coil 41 or coils 56 or 57. The magnetic bias point of drive rod 36 affects the hysteresis of the rod 36 and can thus serve as a parameter for influencing the operational performance of this mode.

The excitation coil 41, sensing coil 56 and damping coil 57 in each transducer 21 can be used individually, sequentially or in combination. Controller 42 allows for interchangeable and simultaneous modes of operation of each transducer 21 and the individual coils for actuation, sensing and damping facilitate efficient execution of simultaneous modes of operation. Controller 42 permits transition from one mode to another to be accomplished manually or to be automatically triggered by an external event such as reaching a vibration threshold. The self-sensing from sensing coil 56 provides a collocated feedback reference signal for controller 42.

In examples of operation, unwanted vibrational forces experienced by elongate member 22 can be measured by controller 42 by means of sensing coils 56 and then counteracted or canceled by a resultant force exerted on the elongate member by the transducers 21. The magnitude and direction of the counteracting resultant force can be determined by a suitable program or algorithm provided in controller 42 and generated by one or more of the drive rods 36 by appropriate electrical signals supplied by the controller 42 to one or more of the excitation coils 41. Should simultaneous damping be required by any or all of the transducers 21, the damping coils 57 in combination with the shunting means of controller 42 can be utilized. In addition, the hysteretic damping of one or more of drive rods 36 can also be effectively utilized by programming of controller 42. In another example of the method and operation of transducers 21, the excitation, sensing and damping functions of any or all of the transducers 21 can be used in sequence. Alternatively, sensing may be required by only one of transducers 21 while excitation or damping is required by one or two of the other transducers 21. In another mode of operation, the transducers 21 can be utilized solely for sensing for an extended period of time. Thereafter, one or more of the transducers 21 can be utilized solely for excitation or vibration of elongate member 22. As can be seen, controller 42 can be configured so as to provide a broad range of operation for transducers 21.

A giant magnetostrictive material, such as TERFENOL-D, is a particularly desirable material for transducer 21 and the smart material of drive rod 36. The large magnetomechanical losses of a giant magnetostrictive material enhance its capability for passive damping. The high thermal conductivity of the material permits adequate heat removal. In addition, the performance of the material can be tailored by modifying easily adjustable operating conditions, resulting in a large potential design space for a given application. Giant magnetostrictive materials such as TERFENOL-D are also advantageous because of their reversible characteristics; that is, they are efficient at converting magnetic energy to mechanical energy and at converting mechanical energy to magnetic energy.

Although elongate member 22 is shown as having only three transducers 21 mounted thereabout, it should be appreciated that less then three or more then three transducers 21 can be provided if desired or required. In addition, although a single controller 42 has been described for operating all three transducers 21, it should be appreciated that a separate controller 42 can be provided for each transducer 21 and be within the scope of the present invention.

In other embodiments, a single coil or other means for generating a magnetic field through drive rod 36 can be provided for performing more than one of the excitation, sensing and damping functions described above. For example, an embodiment having no sensing coil 56 could be provided where excitation and sensing could each be accomplished, either separately or even simultaneously, by excitation coil 41. In another example, damping coil 57 could be eliminated where excitation coil 41 is also used to convert unwanted magnetic energy generated by the coil 41 to electrical energy for dissipation by controller 42. In another embodiment of the invention, a single coil can be utilized to provide each of the excitation, sensing and damping functions described above. In addition, embodiments having more than one excitation coil, more than one sensing coil and/or more than one damping coil can be provided. It should also be appreciated that the tubular means 41, 56 and 57 can be other than coils, for example made from strips, and be within the scope of the present invention.

Transducer 21 is scalable such that transducers of physical dimensions on the order of centimeters or less as well as on the order of tens of centimeters or more are permitted.

In another embodiment of the invention, a transducer 101 substantially similar to transducer 21 is shown in FIG. 5. Transducer 101 can be substituted for one or all of the transducers 21 shown in FIGS. 1 and 2. Like reference numerals are used to identify like components of transducer 21 and transducer 101. In place of bias magnet 61, transducer 101 has magnetic biasing means in the form of at least one and as shown first and second end magnets 102 and 103 disposed against first and second end portions 36a and 36b of drive rod 36. Spaced-apart bias magnets or members 102 and 103 are made of a suitable material such as the material of bias magnet 61 and are included within the means of transducer 101 for providing a substantially uniform dc magnetic bias through drive rod 36.

First and second bias magnets 102 and 103 are included within the means of transducer 101 for providing a longitudinal preload or prestress on drive rod 36 to externally cause the magnetic moments of the magnetostrictive material of the drive rod 36 to be more perfectly oriented perpendicular to the longitudinal axis 37 of the drive rod 36. Bias magnets 102 and 103 are substantially disk-like in shape and have a magnetic density and mass so that the mutual magnetic attraction therebetween is sufficient to produce the desired preload on drive rod 36. As shown, each of bias magnets or disks 102 and 103 has a diameter larger than the inner diameter of excitation coil 41 which, in turn, has a length less than the contracted length of drive rod 36 so as to permit second bias magnet 103 disposed against the second end portion 36b to move longitudinally free of the excitation coil 41 as the second end portion 36b is driven by excitation coil 41.

In an alternate configuration of the magnetic biasing means of transducer 101, only one of disks 102 and 103 is a permanent magnet and the other disk is made from any suitable magnetic material such as a ferromagnetic material. One preferred material for the other disk is a soft iron. The disks 102 and 103 are constructed so as to provide a suitable magnet bias to drive rod 36. In addition, the magnetic attractive force between the disk which is a permanent magnet and the disk of the ferromagnetic material is sufficient to provide the preload to the drive rod 36.

Drive rod 36 of transducer 101 is connected in a conventional manner to arm 32. Although a stroke amplifier is not shown in FIG. 5, stroke amplifier 92 or any other suitable stroke amplifier can be used with transducer 101 for increasing the stroke of arm 32 relative to the change in length of drive rod 36.

In operation and use, the utilization of bias magnets 102 and 103 to both preload and magnetically bias the drive rods 36 of transducer 101 reduces the number of components of the transducer of the present invention.

It should be appreciated that the transducers of the present invention can have excitation, sensing and damping coils therein of various relative sizes and shapes. In this regard, a transducer 111 substantially similar to transducers 21 and 101 is shown in FIG. 6. Transducer 101 can be substituted for one or all of the transducers 21 shown in FIGS. 1 and 2. Like reference numerals are used in FIG. 6 to describe like components of transducer 111 and transducers 21 and 101. The transducer 111 includes elongate tubular sensing and damping coils 112 and 113 which are made from any suitable material such as the material of sensing and damping coils 56 and 57 and are concentrically aligned relative to each other and drive rod 36. Specifically, the tubular sensing coil 112 is concentrically disposed around drive rod 36 and has an inner diameter slightly larger than the outer diameter of drive rod 36. The tubular damping coil 113 is concentrically disposed around the outside of sensing coil 112 and has an inner diameter slightly larger than the outer diameter of sensing coil 112. Excitation coil 41 is concentrically disposed around the outside of damping coil 113 and has an inner diameter slightly larger than the outer diameter of damping coil 113. Sensing and damping coils 112 and 113 each have a length approximately equal to the length of excitation coil 41 and less than the length of drive rod 36 so as to permit second bias magnet 103 to move longitudinally free of the coils as the drive rod 36 expands and relaxes longitudinally along longitudinal axis 37.

Transducer 111 operates in substantially the same manner as transducer 101.

As can be seen from a comparison of transducers 21, 101 and 111, the size, shape and relative position of the excitation, sensing and damping coils can be varied. In another embodiment (not shown), excitation coil 41, sensing coil 56 and damping coil 57 can be concentrically disposed on drive rod 36 in axial alignment with other, either spaced apart or end to end. In general, the size of and shape of each of these coils is determined, in part, by the desired strength and/or sensitivity of the coil and its distance from drive rod 36.

In a further embodiment, a transducer 121 in which the various coil magnets are not concentrically disposed about the active drive rod is shown in FIG. 7. A plurality of transducers 121 can be disposed within respective housings similar to housings 27 for use on a structure similar to elongate member 22. Like reference numerals have been used to describe like components of transducer 121 and transducer 21. Transducer 121 includes a cylindrical drive rod 122 which extends along a central longitudinal axis 123 and has first and second end portions 122a and 122b. The drive rod 122 is made from the same material as drive rod 36.

Drive rod 122 is supported by a C-shaped structure 126 made from any suitable magnetic material such as those used for laminated electrical transformer cores. Magnetic structure 126 has a cylindrical central portion 127 extending along a central longitudinal axis 128 aligned parallel to longitudinal axis 123. First and second spaced-apart, elongate portions 131 and 132 are connected at right angles to central portion 127. First portion 131 extends from the top of central portion 127 across first end portion 122a of drive rod 122 and second portion 132 extends from the bottom of central portion 127 across the second end portion 122b of the drive rod 122. Drive rod 122 is disposed between the ends of portions 131 and 132 and is secured thereto by any suitable means such as an adhesive. Portions 127, 131 and 132 each have a cross-section which is rectangular in shape and preferably square in shape. The portions 127, 131 and 132 are part of the magnetic circuit which provides a uniform dc magnetic bias through drive rod 122. In an alternate embodiment, one or more or the portions 127, 131 and 132 can be a permanent magnet within the magnetic circuit of structure 126.

Transducer 121 has means for producing a varying electromagnetic field which extends through at least a portion of drive rod 122 to change the shape of the drive rod, for sensing movement of the drive rod 122 and for damping movement of the drive rod 122. An excitation coil 136, a sensing coil 137 and a damping coil 138 respectively similar to excitation coil 41, sensing coil 56 and damping coil 57 are concentrically mounted about central portion 127 of magnetic structure 126. As shown in FIG. 7 and 8, sensing and damping coils 137 and 138 are disposed about central portion 127 in axial alignment relative to longitudinal axis 123 and each have an inner diameter greater than the width of central portion 127. Excitation coil 136 is concentrically disposed about sensing and damping coils 137 and 138 and has an inner diameter slightly larger than the outer diameter of coils 127 and 128 and a length approximately equal to the aggregate length of the sensing and damping coils. Wires 141, 142 and 143 respectively couple excitation coil 136, sensing coil 137 and damping coil 138 to controller 42.

In operation and use, magnetic structure 126 operates to transmit the magnetic field generated by excitation coil 136 to and through drive rod 122. Specifically, the magnetic energy from excitation coil 136 is transmitted through the material of portions 127, 131 and 132 to drive rod 122. In a similar manner, magnetic energy generated by vibrational or other external compressive forces on drive rod 122 is transmitted by magnetic structure 126 to sensing and damping coils 137 and 138. Excitation coils 136, sensing coil 137 and damping coil 138 can be utilized with controller 42 and power supply 46 in the same manner discussed above with respect to transducer 21 to control the movement of an external structure such as elongate member 22 on which one or more transducers 121 is mounted.

The physical separation of drive rod 122 and coils 136–138 facilitates heat removal from both the drive rod and the coils and thus improves the operation of transducer 121. Interchangeableness of components of the transducer 121 is also made easier.

The size, shape and relative location of the coils 136–138 of transducer 121 can be many, as discussed above for transducers 21, 101 and 111. In addition, the coils 136–138 can be located elsewhere on magnetic structure 126, such as on one or both of portions 131 and 132.

In a further embodiment of the present invention, a transducer 151 substantially similar to transducer 121 is shown in FIG. 9. Like reference numerals have been used to describe like components of transducers 151 and 121. Transducer 151 has a magnetic structure 152 having a central portion 153 substantially similar to central portion 127 and made from the same material as central portion 127. Structure 152 further includes first and second portions 156 and 157 substantially similar to first and second portions 131 and 132, except that portions 156 and 157 are separated from central portion 153 so as to be movable freely relative to central portion 153. First and second portions 156 and 157 are made from any suitable material such as those used for laminated electrical transformer cores so as to be capable of being included within the means of transducer 151 for providing a substantially uniform dc magnetic bias to drive rod 122. First and second portions 156 and 157 also are included within the means of transducer 151 for providing a preload to drive rod 122 for the purpose discussed above with respect to transducer 101.

In operation and use, transducer 151 can be operated in substantially the same manner as transducer 121 to control the movement of a structural member to which transducer 151 or a plurality of transducers 151 are attached. First and second portions 156 and 157 of magnetic structure 152 serve to magnetically bias drive rod 122 and also serve to provide a mechanical preload in the drive rod along the longitudinal axis 123. In addition, portions 156 and 157 serve to transmit magnetic energy between drive rod 122 and coils 136–138.

The integrated multi-mode transducers herein can be provided without prestressing or preloading means. In addition, the DC biasing means described herein can be constructed without the use of permanent magnets. For example, one of the coils disposed around the magnetostrictive drive rod can be provided with a DC current, separately or in combination with an AC current, to produce the DC magnetic field through the drive rod. It should be further appreciated that the transducers herein can have other embodiments including less than all of the components described herein and be within the scope of the present invention.

From the foregoing, it can be seen that a transducer and method has been provided which permits flexibility in the combination of actuation, sensing and damping of structures. The transducer and method can have a drive element made from a magnetostrictive material. In such a transducer and method, the hysteretic damping of the magnetostrictive drive element is utilized. At least one bias magnet can provide the mechanical preload to the magnetostrictive drive element.

What is claimed is:

1. An integrated multi-mode transducer for use with a member to control movement of the member comprising an active element adaptable to engage the member, the active element changeable from a first shape to a second shape in the presence of an electromagnetic field, means including a controller for producing an electromagnetic field which extends through at least a portion of the active element to change the shape of the active element and thus exert a force on the member, for sensing movement of the member and for damping movement of the member, said means including a first coil for changing the shape of the active element and thus moving the member, a second coil for sensing motion of the active element and a third coil for damping motion of the active element.

2. The transducer of claim 1 wherein the active element is made from a magnetostrictive material.

3. The transducer of claim 2 wherein the active element is made from a rare earth-iron magnetostrictive material.

4. The transducer of claim 3 wherein the active element is made from TERFENOL-D.

5. The transducer of claim 2 wherein the active element is in the form of a rod.

6. The transducer of claim 1 wherein at least one of the first coil, the second coil and the third coil is concentrically disposed about the active element.

7. The transducer of claim 5 wherein the rod is centered on a first longitudinal axis and at least one of the first coil, the second coil and the third coil is centered on a second longitudinal axis spaced apart from the first longitudinal axis.

8. The transducer of claim 5 together with first and second spaced-apart members of a magnetic material for magnetically biasing the rod and for compressing the rod to create a prestress in the rod.

9. A transducer comprising an active element made from a magnetostrictive material, the active element changeable from a first shape to a second shape in the presence of a magnetic field, the active element having first and second end portions and a longitudinal axis extending between the first and second end portions, means for producing a magnetic field which extends through at least a portion of the active element for changing the shape of the active element and first and second spaced-apart magnetic members disposed adjacent the first and second end portions so that the active element extends between the first and second magnetic members for magnetically biasing the rod and for compressing the rod to create a mechanical prestress in the rod.

10. The transducer of claim 9 wherein the active element is a rod made from a giant magnetostrictive material.

11. The transducer of claim 10 wherein at least one of the first and second spaced-apart magnetic members is a permanent magnet.

12. The transducer of claim 11 wherein each of the first and second spaced-apart magnetic members is a permanent magnet.

* * * * *